(12) United States Patent
Chang et al.

(10) Patent No.: US 10,121,710 B2
(45) Date of Patent: Nov. 6, 2018

(54) METHODS FOR MANUFACTURING A DISPLAY DEVICE

(71) Applicant: Innolux Corporation, Miao-Li County (TW)

(72) Inventors: Chia-Hsiung Chang, Miao-Li County (TW); Ting-Kai Hung, Miao-Li County (TW); Hsiao-Lang Lin, Miao-Li County (TW)

(73) Assignee: INNOLUX CORPORATION, Miao-li (TW)

( * ) Notice: Subject to any disclaimer, the term of this patent is extended or adjusted under 35 U.S.C. 154(b) by 0 days.

(21) Appl. No.: 15/409,809

(22) Filed: Jan. 19, 2017

(65) Prior Publication Data

US 2017/0358505 A1    Dec. 14, 2017

Related U.S. Application Data

(60) Provisional application No. 62/350,169, filed on Jun. 14, 2016.

(51) Int. Cl.
| | |
|---|---|
| *H01L 21/00* | (2006.01) |
| *H01L 21/66* | (2006.01) |
| *H01L 25/16* | (2006.01) |
| *H01L 25/00* | (2006.01) |
| *H01L 33/44* | (2010.01) |
| *H01L 33/52* | (2010.01) |

(Continued)

(52) U.S. Cl.
CPC ............ *H01L 22/22* (2013.01); *H01L 25/167* (2013.01); *H01L 25/50* (2013.01); *H01L 33/44* (2013.01); *H01L 33/52* (2013.01); *H01L 33/62* (2013.01); *H01L 27/1214* (2013.01); *H01L 2933/0066* (2013.01)

(58) Field of Classification Search
CPC ........ H01L 22/22; H01L 25/167; H01L 25/50
USPC ........................................................... 438/10
See application file for complete search history.

(56) References Cited

U.S. PATENT DOCUMENTS

| | | |
|---|---|---|
| 9,159,700 B2 | 10/2015 | Sakariya et al. |
| 2011/0309378 A1 | 12/2011 | Lau et al. |

(Continued)

OTHER PUBLICATIONS

Chinese language office action dated Oct. 6, 2017, issued in application No. TW 106114063.

*Primary Examiner* — David S Blum
(74) *Attorney, Agent, or Firm* — McClure, Qualey & Rodack, LLP

(57) ABSTRACT

Methods for manufacturing a display device are provided. A representative method includes: providing a thin film transistor (TFT) substrate having a plurality of sub-pixel locations and a plurality of TFTs corresponding to the plurality of sub-pixel locations; providing a carrier substrate supporting a plurality of light emitting diodes (LEDs), wherein each of the plurality of LEDs has a first electrical contact and a second electrical contact; transferring the plurality of LEDs from the carrier substrate to the TFT substrate, with at least two of the plurality of LEDs being disposed at one of the plurality of sub-pixel locations; and fixing positions of the plurality of LEDs with respect to the TFT substrate. The method also may include: determining that a first LED of the plurality of LEDs is defective; and electrically isolating the first electrical contact of first LED from a first electrode of the display device.

15 Claims, 19 Drawing Sheets

(51) Int. Cl.
   *H01L 33/62*   (2010.01)
   *H01L 27/12*   (2006.01)

(56) References Cited

U.S. PATENT DOCUMENTS

2013/0092910 A1    4/2013  Seo et al.
2017/0162553 A1*   6/2017  Bibl ...................... H01L 25/167

* cited by examiner

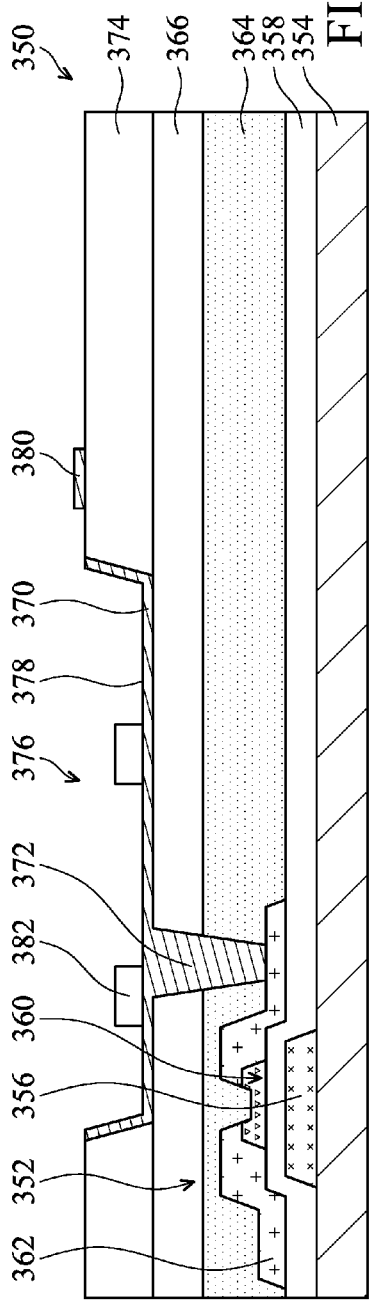
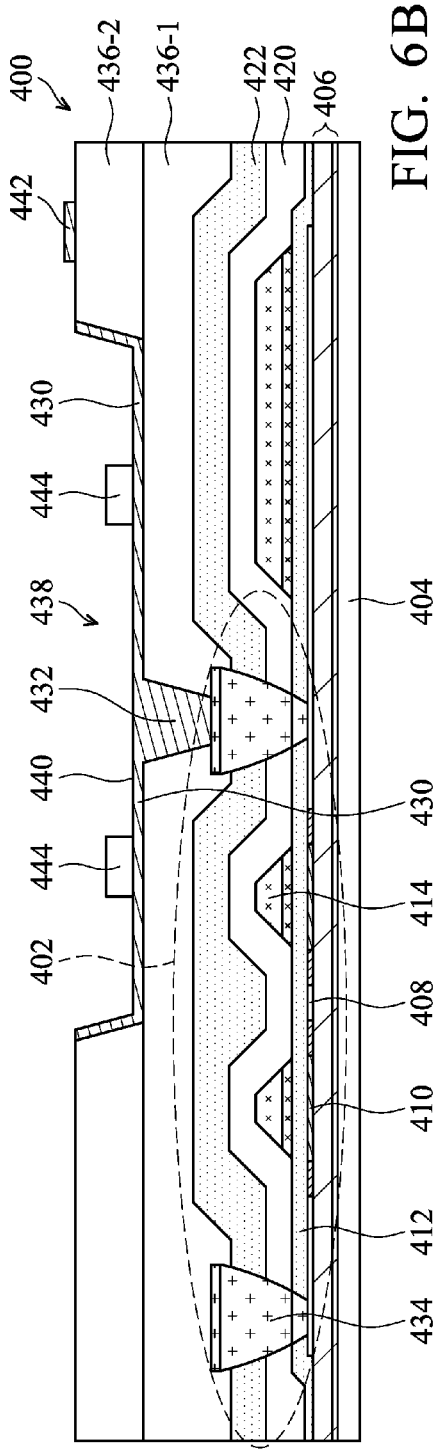
FIG. 6A
FIG. 6B

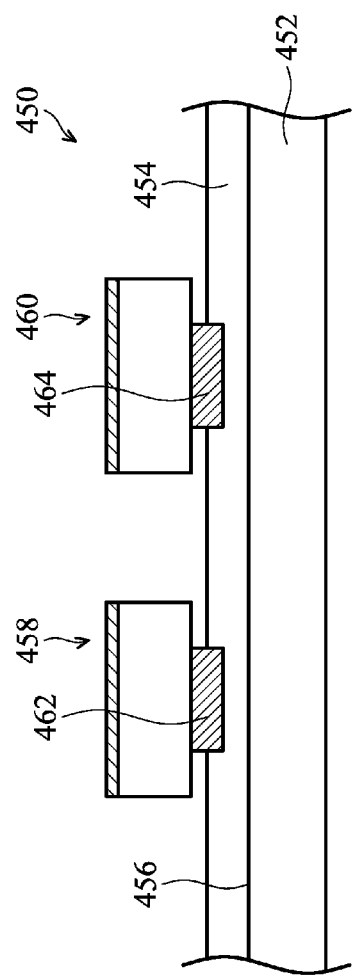
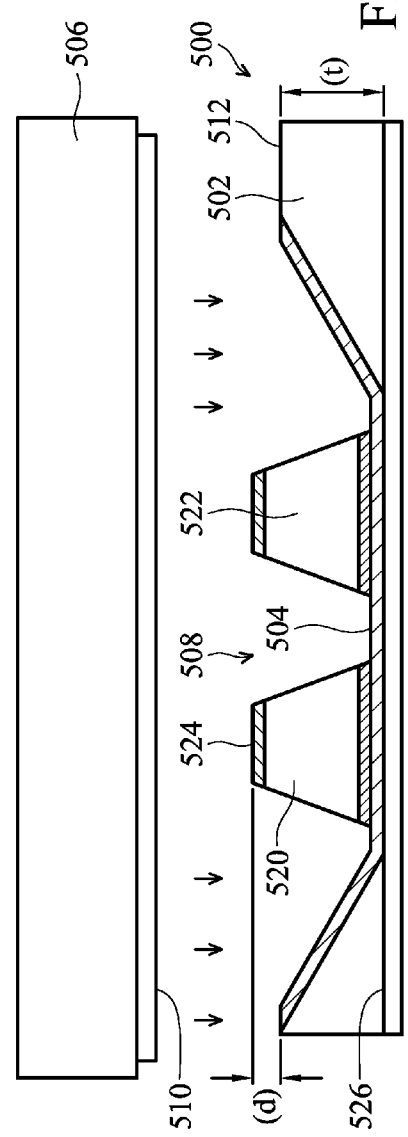

METHODS FOR MANUFACTURING A DISPLAY DEVICE

CROSS-REFERENCE

This utility patent application claims the benefit of and priority to U.S. provisional application 62/350,169, filed on 14 Jun. 2016, which is incorporated by reference herein in its entirety.

BACKGROUND

Technical Field

The disclosure relates to display devices and, in particular, to methods for manufacturing such display devices.

Description of the Related Art

In an effort to meet consumer demand for high quality display devices, industry trends have turned to light emitting diode (LED) technology. Although considered a relatively mature technology in general, advancements in LEDs, such as through the development of micro-LEDs (sometimes referred to as "mLEDs" or "µLEDs") have drawn attention. However, numerous technical challenges exist in their implementation.

BRIEF DESCRIPTION OF THE DRAWINGS

Many aspects of the disclosure can be better understood with reference to the following drawings. The components in the drawings are not necessarily to scale, emphasis instead being placed upon clearly illustrating the principles of the present disclosure. Moreover, in the drawings, like reference numerals designate corresponding parts throughout the several views.

FIGS. 6A and 6B are schematic, cross-sectional views of example embodiments of thin film transistor (TFT) substrates.

FIG. 7 is a schematic, cross-sectional view of an example embodiment of a carrier substrate.

FIG. 8 is a schematic, cross-sectional view of an example embodiment of a TFT substrate showing detail of the insulating layer in providing mechanical clearance with a transfer head.

DETAILED DESCRIPTION

Figure 1:
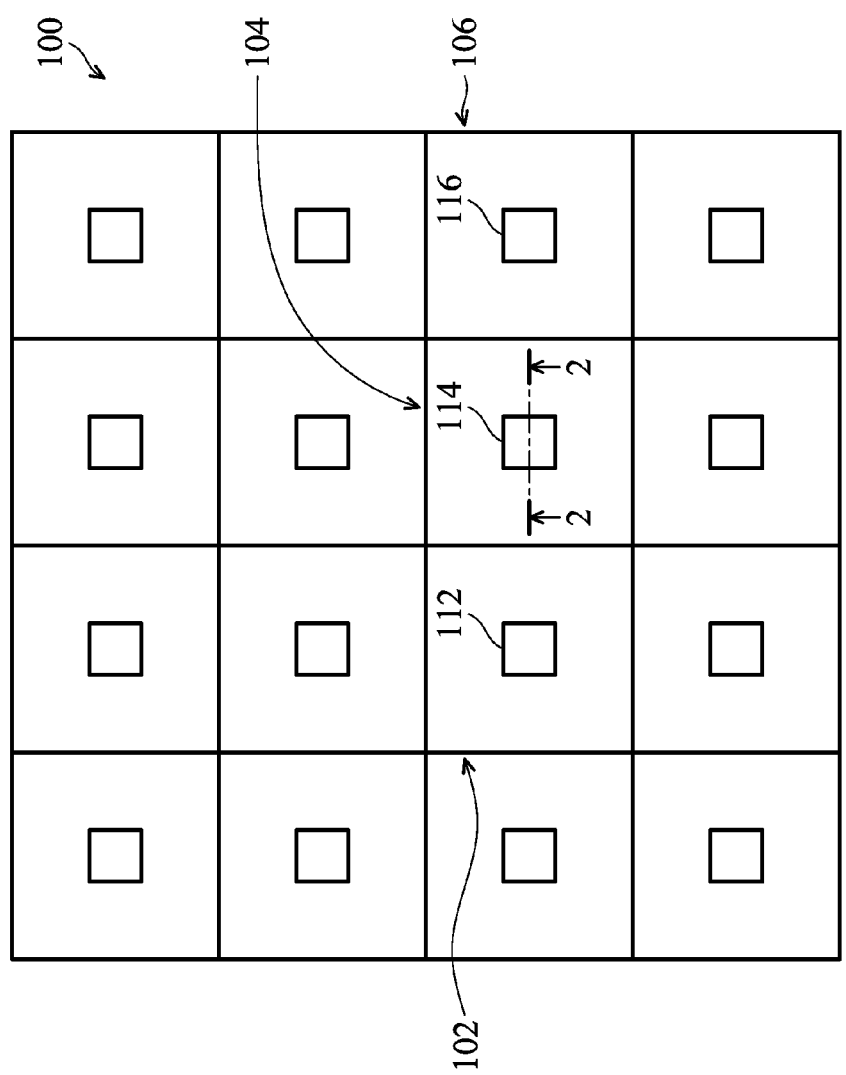
FIG. 1 is a schematic, plan view of an example embodiment of a display device, showing a plurality of sub-pixels.

Reference will now be made in detail to that which is illustrated in the drawings. While the disclosure will be described in connection with these drawings, there is no intent to limit the scope of legal protection to the embodiment or embodiments disclosed herein. Rather, the intent is to cover all alternatives, modifications and equivalents included within the spirit and scope of the disclosure.

In this regard, embodiments of a method for manufacturing a display device are provided. In some embodiments, the method involves an integrated process in which light emitting diode (LED) placement is performed in combination with one or more of various other procedures such as testing, defect repair, and layer (e.g., light guide layer) formation, for example. In some embodiments, an LED is provided at a sub-pixel location. In some embodiments, at least two LEDs are provided at a sub-pixel location, thereby providing component redundancy for each sub-pixel. In the event that an LED at a sub-pixel location is identified as being defective, the defective LED may be electrically isolated from a first electrode of the display device, thus potentially mitigating unwanted impacts of the defective LED while permitting the other of the LEDs to emit light. In some embodiments, a passivation layer is formed over a defective LED to electrically isolate that LED from the first electrode. In other embodiments, a laser cutting is provided to cut off the first electrode and electrically isolate the first electrical contact of the LED.

FIG. 1 is a schematic, plan view of an example embodiment of a display device 100, which may be used in a variety of devices, such as mobile devices. Display device 100, only a portion of which is depicted, incorporates a plurality of sub-pixels (e.g., sub-pixels 102, 104 and 106), with each of the sub-pixels including at least one LED (e.g., a micro-LED). For instance, sub-pixels 102, 104 and 106 include LEDs 112, 114 and 116, respectively.

Figure 2:
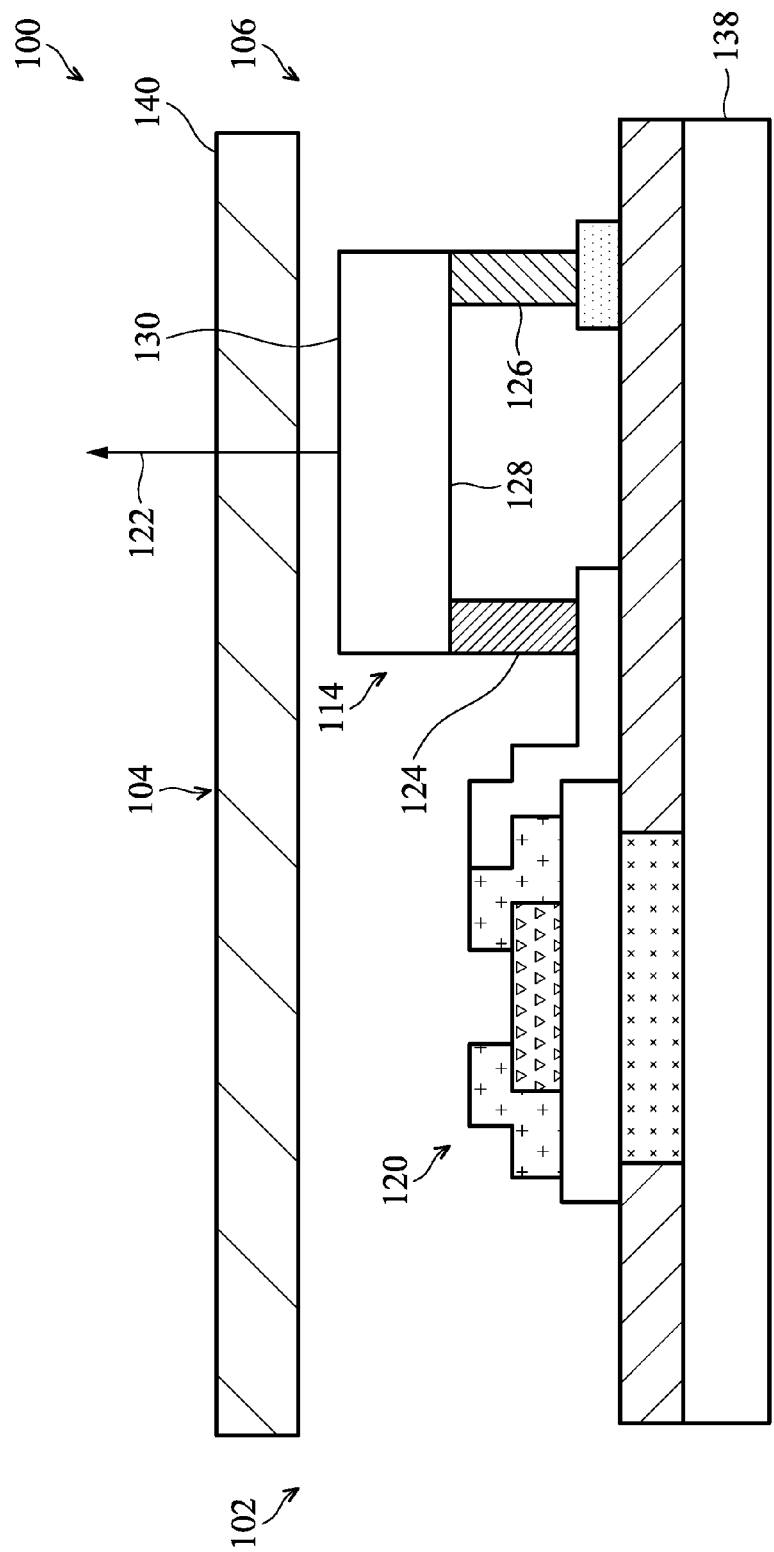
FIG. 2 is a schematic, cross-sectional view of an example embodiment of a display device, showing detail of a sub-pixel, as viewed along section line 2-2 of FIG. 1.

Additional detail of sub-pixel 104 is depicted in FIG. 2. Specifically, sub-pixel 104 incorporates a thin film transistor (TFT) 120, which controls LED 114 in response to control signals provided by source electrode and gate lines (not shown) as is known. Each of the sub-pixels of display device 100 incorporates a TFT for controlling operation of the corresponding LED to produce light (e.g., light produced by LED 114 is depicted by arrow 122). In this embodiment, electrical contacts (124, 126) of LED 114 are provided on a bottom 128 of the LED opposite a light-emitting top 130 of the LED.

The LEDs and TFTs of display device 100 are supported by a TFT substrate 138 upon which the TFTs are formed. The TFT substrate could be rigid or flexible. The material of the TFT substrate could be glass, plastic (Polyimide (PI) or PET), for example. A cover (e.g., a glass cover, a polarizer, a barrier film or capping layer (inorganic-organic-inorganic layers)) 140 also is provided as an outer protective covering of the display device 100.

Figure 3:
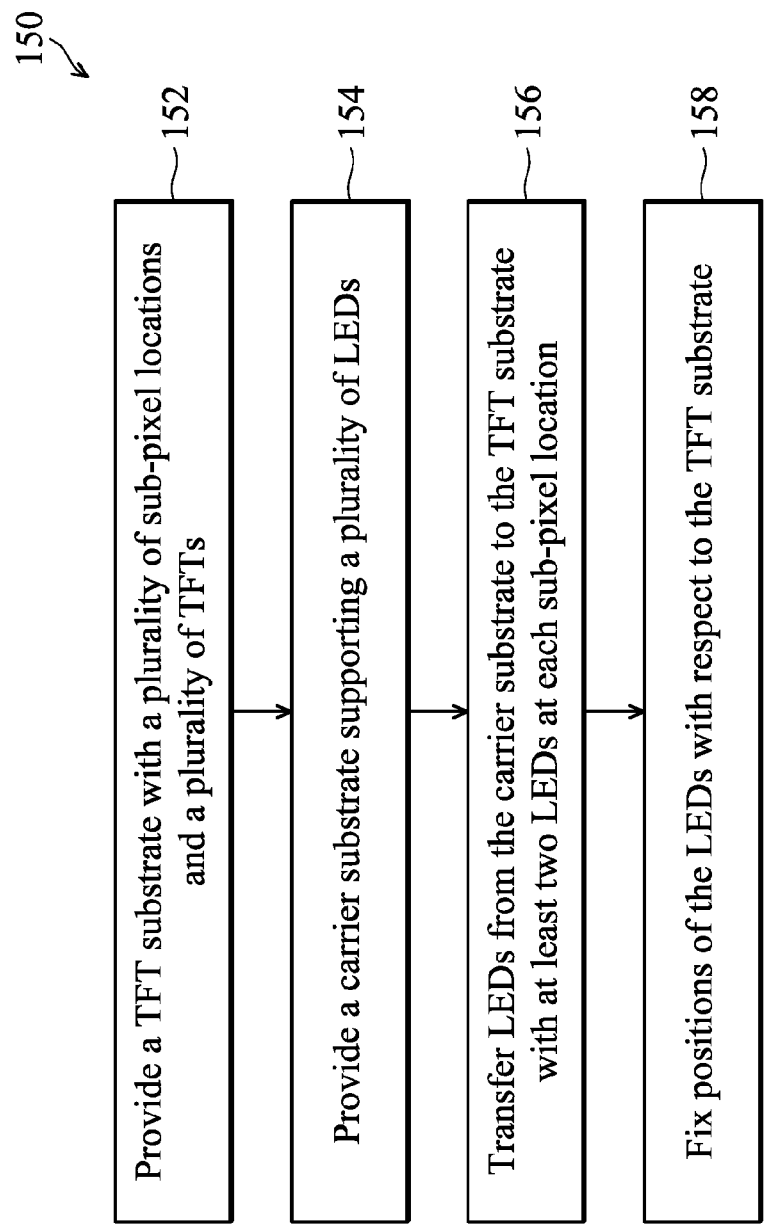
FIGS. 3-5 are flowcharts depicting example embodiments of a method for manufacturing a display device.

FIG. 3 is a flowchart depicting an example embodiment of a method 150 for manufacturing a display device, such as display device 100 of FIG. 1, for example. As shown in FIG. 3, method 150 may be construed as beginning at block 152, in which a TFT substrate is provided that incorporates a plurality of sub-pixel locations (i.e., locations at which sub-pixels are to be formed) and a plurality of TFTs corresponding to the sub-pixel locations. In block 154, a carrier substrate supporting a plurality of LEDs is provided. Specifically, each of the LEDs includes a first electrical contact and a second electrical contact. In block 156, the plurality of LEDs is transferred from the carrier substrate to the TFT substrate, with at least two of the plurality of LEDs being disposed at each of the plurality of sub-pixel locations. It should be noted that transferring of the LEDs may be performed in multiple transfer steps involving a subset of the LEDs at each step as the total amount of the LEDs may be too large to be transferred at one time. In some embodiments, a transfer head of pick-and-place equipment is used to transfer the LEDs from the carrier substrate to the TFT substrate. Then, as depicted in block 158, positions of the plurality of LEDs are fixed with respect to the TFT substrate. As a result, at least two LEDs are fixed at each of the sub-pixel locations of the TFT substrate to form a corresponding sub-pixel.

Figure 4:
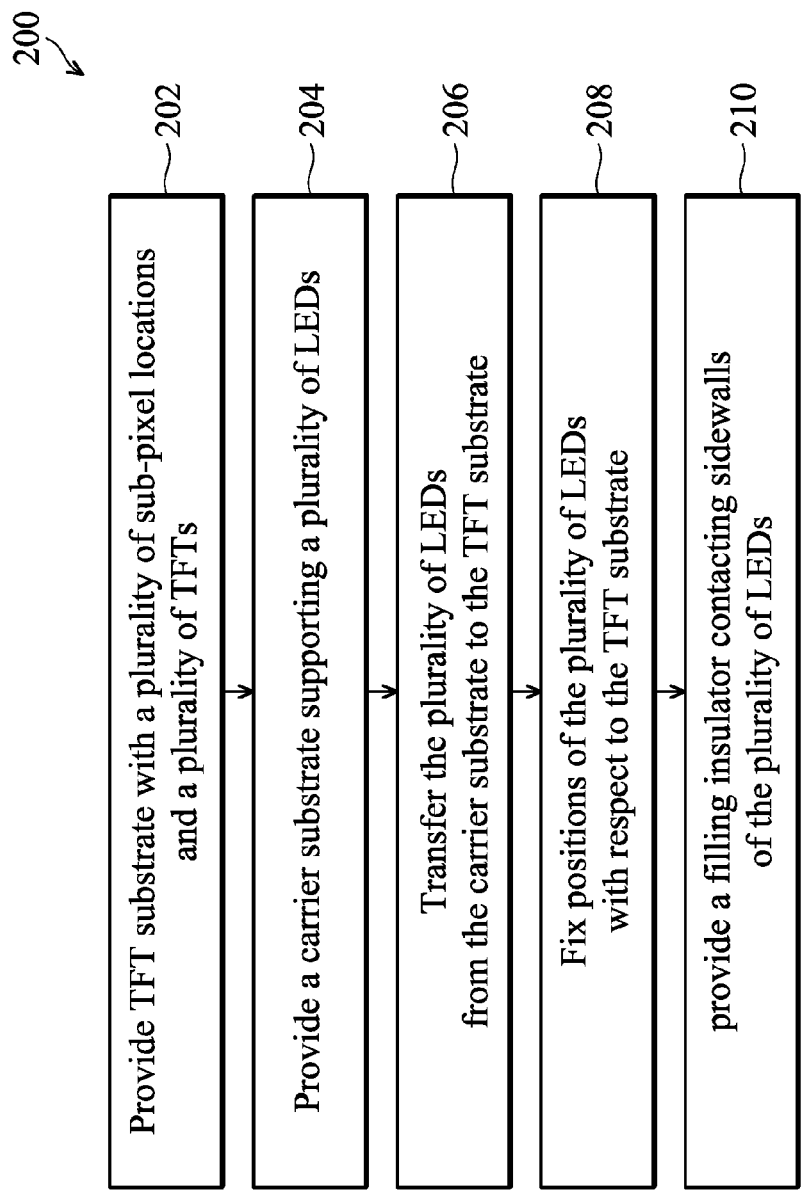

Another example embodiment of a method for manufacturing a display device is depicted in the flowchart of FIG. 4. As shown in FIG. 4, method 200 may be construed as beginning at block 202, in which a TFT substrate with a plurality of sub-pixel locations and a plurality of TFTs is provided. In block 204, a carrier substrate supporting a plurality of LEDs is provided. Specifically, each of the plurality of LEDs supported by the carrier substrate includes a first electrical contact and a second electrical contact. In block 206, the plurality of LEDs is transferred from the carrier substrate to the TFT substrate, with a corresponding one of the plurality of LEDs being disposed at each of the plurality of sub-pixel locations. It should be noted that transferring of the LEDs may be performed in multiple transfer steps involving a subset of the LEDs at each step as the total amount of the LEDs may be too large to be transferred at one time. Thereafter, such as depicted in block 208, positions of the plurality of LEDs are fixed with respect to the TFT substrate. By way of example, the LEDs may be bonded to the TFT substrate with bonding material.

In block 210, a filling insulator is provided. In particular, the filling insulator contacts sidewalls of the plurality of LEDs.

It should also be noted that, in some embodiments, prior to providing the filling insulator, a determination may be made regarding whether a first LED of the plurality of LEDs is defective. Responsive to identifying that the first LED is defective, a first electrical contact of the first LED may be electrically isolated from a first electrode of the display device. In some embodiments, electrically isolating an LED may involve providing a passivation layer over and/or laser cutting an electrical contact of the defective LED. As mentioned previously, electrical isolation of the LED in this manner may potentially mitigate unwanted impacts of the defective LED.

The process of defect detection may be performed as desired among the plurality of LEDs, and defect repair may be provided in a single process to electrically isolate multiple LEDs identified as being defective. If, however, it is determined that no LEDs are defective, the defect repair step may be omitted.

Figure 5:
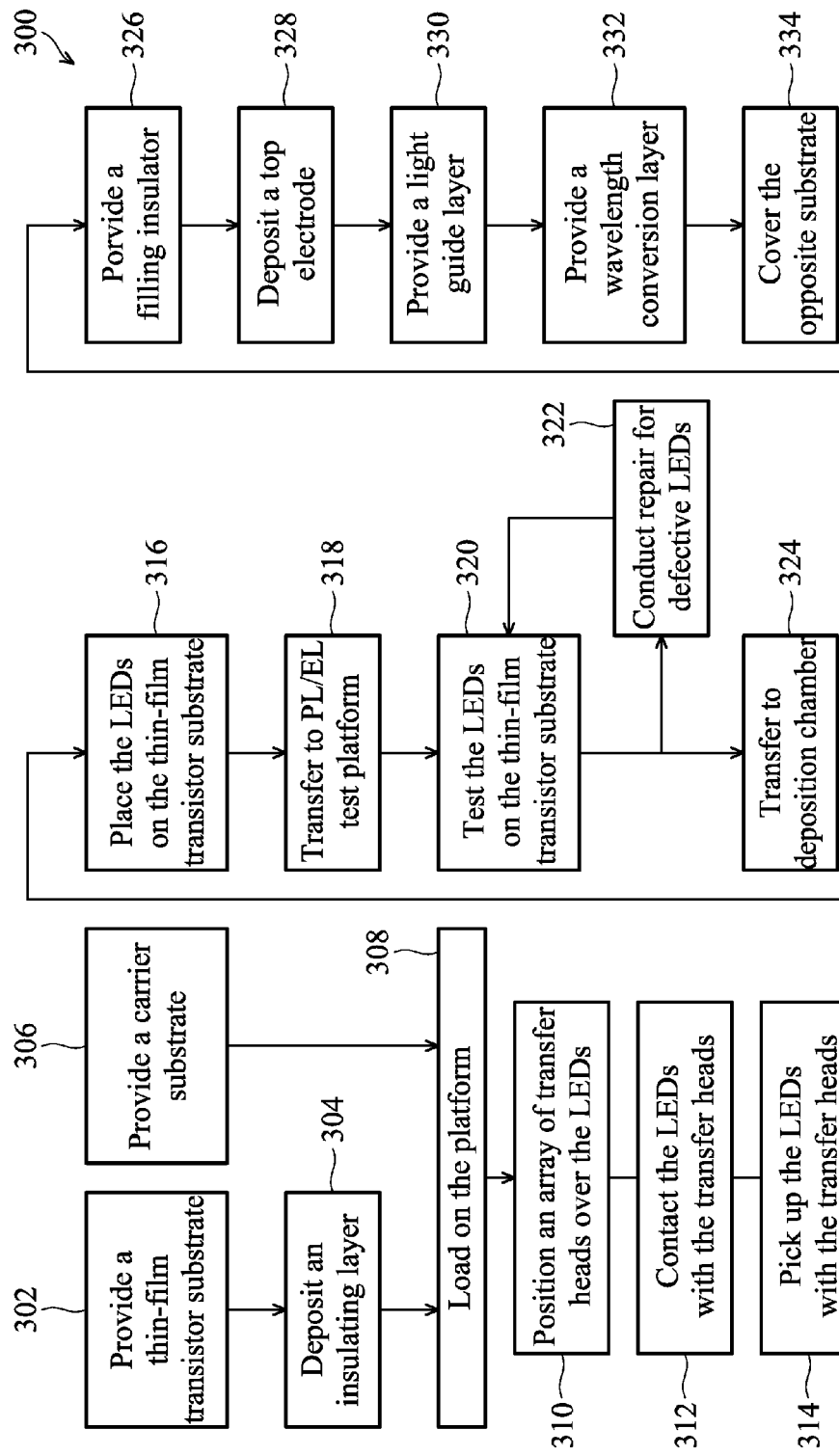

Still another example embodiment of a method for manufacturing a display device is depicted in the flowchart of FIG. 5. It should be noted that the flowchart of FIG. 5 includes numerous steps/processes that may be considered optional in some embodiments. Additionally, although shown in a particular sequence of steps/processes for purposes of expediency, various other orderings of the steps/processes may be used in other embodiments. Further, the steps/processes described in relation to FIG. 5 are described in greater detail with reference to subsequent figures.

As shown in FIG. 5, method 300 may be construed as beginning at block 302, in which a TFT substrate is provided. As will be described in greater detail with respect to FIGS. 6A and 6B, a TFT substrate may be provided in various configurations, such as top gate TFT or bottom gate TFT. The material of active layer (channel) of a TFT may be amorphous silicon (a-Si), metal oxide or low temperature polysilicon (LTPS), among others. In block 304, an insulating layer is deposited on the TFT substrate. Specifically, the insulating layer is provided to establish adequate clearance between the operational surfaces of transfer components used in transferring LEDs to the TFT substrate as will be described in greater detail with respect to FIG. 8. In block 306, a carrier substrate is provided, which includes LEDs to be transferred to the TFT substrate. An example embodiment of a carrier substrate and associated TFTs is described later with respect to FIG. 7. Notably, one or more of various tests may be performed on the TFT substrate and/or carrier substrate (such as described with respect to FIGS. 9 and 10). Thereafter, such as presented in block 308, the TFT substrate and carrier substrate are loaded onto a platform to facilitate LED transfer and placement.

As shown in block 310, an array of transfer heads is positioned over the LEDs of the carrier substrate, and in block 312 the transfer heads are placed in contact with the LEDs. Then, as presented in blocks 314 and 316, the transfer heads pick up the LEDs and place the LEDs on the TFT substrate. The process of transferring and placing the LEDs will be described in greater detail with reference to FIGS. 11A, 11B, 12A and 12B.

Proceeding to block 318, the TFT substrate with the placed LEDs is transferred to a test platform to facilitate one or more of various tests, such as photoluminescence and electroluminescence testing (described later with respect to FIGS. 13A and 13B). After determining that an LED is defective, the process may proceed to block 322, at which repair of the defective LED may be conducted (see, FIGS. 15, 23 and 24 for more detail). Subsequently, the TFT substrate may be transferred to a deposition chamber such as depicted in block 324.

Beginning in block 326, positioning within the deposition chamber may facilitate further fabrication. Specifically, as presented in block 326 (and with further description to follow in relation to FIG. 14), a filling insulator may be provided. In block 328, a first electrode of the display device is deposited (see, FIGS. 16, 17A and 17B). Then, such as depicted in blocks 330 and 332, a light guide layer (FIG. 18) and a wavelength conversion layer (FIG. 19) may be provided. The opposite substrate is then covered (with or without the incorporation of a color filter) as shown in block 334 (see, FIG. 20).

In FIG. 6A, an example embodiment of a TFT substrate 350 configured with a bottom gate TFT 352 is depicted. In preparing TFT substrate 350, various processes may be used. Specifically, a substrate 354 (e.g., a rigid or flexible substrate) is provided upon which a metal layer (M1) layer 356 is patterned to form gate electrode and gate/scan line. A gate insulation layer 358 is deposited, and then subsequently metal (M2) layer 362 is patterned to form source electrode, drain electrode and data lines, following deposition of first and second passivation layers 364 and 366, respectively. A channel 360 is formed in the active layer and between the source and drain electrodes. The first and second passivation layers 364 and 366 have a contact via 372, which is passing through the first passivation layer 364 and second passivation layer 366 to expose at least a portion of the metal layer (M2) 362. In this embodiment, the metal layer (M1) 356 and the metal layer (M2) 362 are multi conductive layers. In other embodiments, the metal layer (M1) 356 and the metal layer (M2) 362 could be a single conductive layer.

Also shown in FIG. 6A is reflective structure 370, which defines a sub-pixel location for the placement of one or more LEDs. In this embodiment, formation of reflective structure 370, deposition insulating layer 374, and then etching an opening 376 in the insulating layer to expose the contact via 372. A metal (M3) layer 378 is then deposited within opening 376 to form the reflective structure and deposited within the contact via 372 to electrically connect to the metal layer (M2) 362. Additionally, metal layer 378 may be used to form common lines (e.g., common line 380) for electrically connecting to a first electrode of the associated display device. The common line 380 may provide a common voltage to the first electrode. An optional bonding (M4) layer 382 formed of bonding material may also be provided at the sub-pixel location over reflective structure 370 to facilitate bonding of one or more LEDs.

Another example embodiment, in which a TFT substrate 400 configured with a top gate TFT 402, is depicted in FIG. 6B. TFT substrate 400 includes a substrate 404 upon which a buffer layer 406 and an active layer 408 are formed. Re-crystallization (e.g., by excimer laser annealing), patterning to form the channel 410, and channel/N+ doping are performed. Gate insulation layer 412 and metal (M1) layer 414 are subsequently deposited and patterned to form gate electrode and gate lines. Thereafter, first and second passivation layers (420, 422) are deposited. Depositing and patterning metal (M2) layer 434 is performed to form source electrode, drain electrode and data lines. In this embodiment, the source and drain electrodes pass through the first and second passivation layers 420 and 422 to electrically connect to the active layer 408. The buffer layer 406 could be a single layer or multi-layers.

TFT substrate 400 also incorporates a reflective structure 430, which defines a sub-pixel location for the placement of one or more LEDs. In this embodiment, first insulating layer 436-1 is deposited and subsequently etched to form contact via 432 in the insulating layer 436-1. Then second insulating layer 436-2 is deposited and subsequently etched to form opening 438 in the second insulating layer 436-2. A metal (M3) layer 440 is then deposited within opening 438 to form the reflective structure 430, as well as common lines (e.g., common line 442), and is also deposited within the contact via 432. The reflective structure 430 is used for electrically connecting to a second electrical contact of the associated display device and a corresponding TFT through the contact via 432. An optional bonding (M4) layer 444 may be provided at the sub-pixel location over reflective structure 430 to facilitate bonding of the LEDs.

An example embodiment of a carrier substrate 450 is depicted in FIG. 7. As shown, carrier substrate 450 includes a substrate 452 with a bonding layer 454 disposed over a top surface 456 of the substrate 452. LEDs (e.g., LEDs 458 and 460) are attached to substrate 452 by bonding layer 454. An example of a material for forming the bonding layer 454 is a low melting temperature metal, metal alloy, conductive polymer, or combination thereof. (e.g., a melting temperature below 350° C., preferably, below 200° C.).

In this embodiment, the LEDs are removably attached to substrate 452 with the bonding material adhering to respective second electrical contacts (462, 464) of the LEDs. Release of the LEDs from carrier substrate 450 is facilitated by heating the bonding material as will be described in detail later.

As shown in the schematic of FIG. 8, an insulating layer 502 of appropriate thickness (t) is provided to establish adequate mechanical clearance between the operational surfaces of transfer components used in transferring LEDs to a TFT substrate and the upper surfaces of the TFT substrate itself. In particular, a portion of a TFT substrate 500 is depicted that includes an insulating layer 502, a reflective structure 504, and a transfer head 506 of pick-and-place equipment.

When placing LEDs at sub-pixel location 508 (defined by reflective structure 504), transfer head 506 typically approaches TFT substrate 500 in a downward motion such that a closest distance between the operational surface 510 of the transfer head and TFT substrate 500 is exhibited with top surface 512 of insulating layer 502. Because of the potential for inadvertent contact during this placement operation, a clearance is established by setting the position of the top surface 512 of the insulating layer 502 relative to a maximum elevation of the LEDs with respect to the TFT substrate.

In this example, the maximum elevation of LEDs 520, 522 is set at the height of the top surface 524 of a representative one of the LEDs. A ratio of the thickness (t) of insulating layer 502 (t being measured between a bottom surface 526 and a top surface 512) and a distance (d) measured between top surface 512 and the maximum elevation 524 would be within a range (R). In this embodiment, the range (R) is between approximately 3% of the thickness (t) and approximately 70% of the thickness (t) of the insulating layer 502, thus ensuring that the top surfaces of the LEDs protrude upwardly beyond the top surface 512 of the insulating layer 502 to provide adequate mechanical clearance for operational surface 510 of the transfer head to prevent transfer head damaging the insulating layer or the TFT substrate. In an embodiment, the range (R) is between approximately 3% of the thickness (t) and approximately 25% of the thickness (t) of the insulating layer 502. In an embodiment, the range (R) is between approximately 3% of the thickness (t) and approximately 15% of the thickness (t) of the insulating layer 502. In an embodiment, the range (R) is between approximately 40% of the thickness (t) and approximately 70% of the thickness (t) of the insulating layer 502. Further, in another embodiment, the thickness (t)

can be measured a portion of the insulating layer above the gate electrode or gate/scan line.

Figure 9:
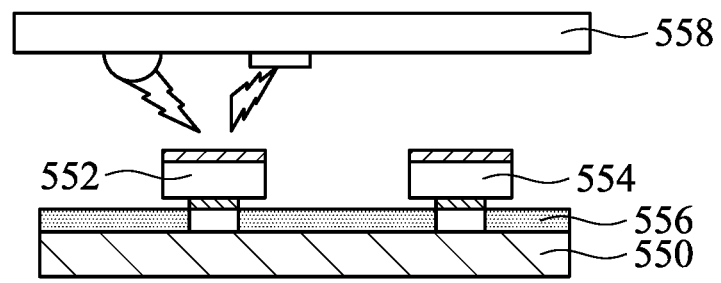
FIGS. 9 and 10 are schematic diagrams depicting example embodiments of testing of LEDs disposed on a carrier substrate.
Figure 10:
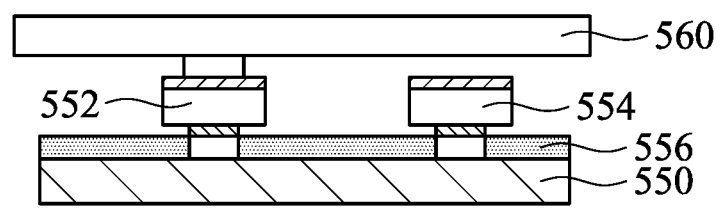

FIGS. 9 and 10 are schematic diagrams depicting representative tests that may be performed on a carrier substrate prior to removing the associated LEDs for placement on a TFT substrate. As shown in FIG. 9, carrier substrate 550 includes multiple LEDs (e.g., LEDs 552 and 554) that may be arranged in an array, with each being are removably attached to the carrier substrate by a bonding layer 556. Test equipment 558 is positioned adjacent to the LEDs to conduct photoluminescence testing of one or more of the LEDs.

In FIG. 10, test equipment 560 is positioned to conduct electroluminescence testing of one or more of the LEDs of carrier substrate 550. It should be noted that various testing may be facilitated in this embodiment owing to conductive properties of bonding layer 556, which enables the LEDs to be energized in a testing circuit. By using one or more testing procedures such as photoluminescence and electroluminescence testing while the LEDs are attached to the carrier substrate, the LEDs may be confirmed as either "good" or "defective" prior to placement.

Figure 11:
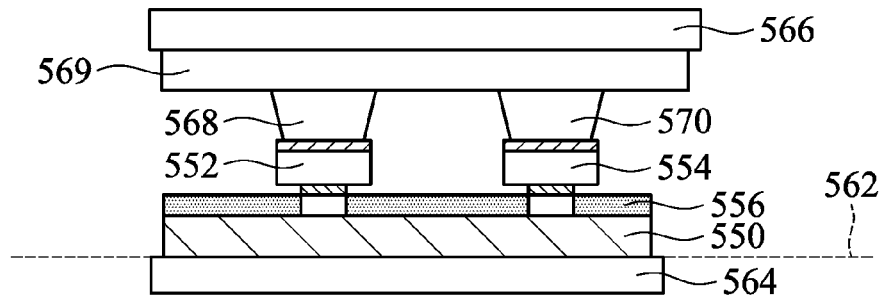
FIGS. 11A and 11B are schematic, cross-sectional views of an example embodiment of a carrier substrate showing removal of LEDs.
Figure 11:
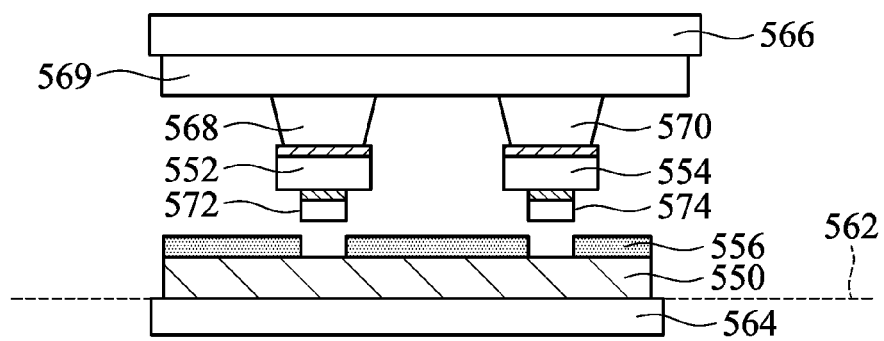

Continuing with the example embodiment of FIGS. 9 and 10, removal of the LEDs will now be described with respect to FIGS. 11A and 11B. As shown in FIG. 11A, carrier substrate 550 has been loaded onto a platform 562 to facilitate LED transfer and placement. Platform 562 incorporates a heater 564 for heating the carrier substrate and the associated bonding layer 556 to a temperature that facilitates release of the LEDs 552, 554 from the carrier substrate.

An array of transfer heads is positioned over the LEDs. In this embodiment, a heater 566 also is incorporated with the transfer head array 569. As is shown, transfer head 568 of transfer head array 569 is positioned over LED 552 and transfer head 570 of transfer head array 569 is positioned over LED 554. After transfer head positioning, the transfer heads are placed in contact with the LEDs for transferring the LEDs to a TFT substrate. Various transfer techniques may be used for selectively retaining (i.e., picking) the LEDs with the transfer heads. By way of example, vacuum, static electricity or magnetic force, among others, may be used. Then, as shown in FIG. 11B, transfer heads 568, 570 pick up LEDs 552 and 554, respectively, after bonding layer 556 has been heated by one or both of heaters 564, 566 to a suitable temperature. It should be noted that bonding material (e.g., material 572, 574) may adhere to and be carried by the LEDs after removal from the carrier substrate.

Figure 12:
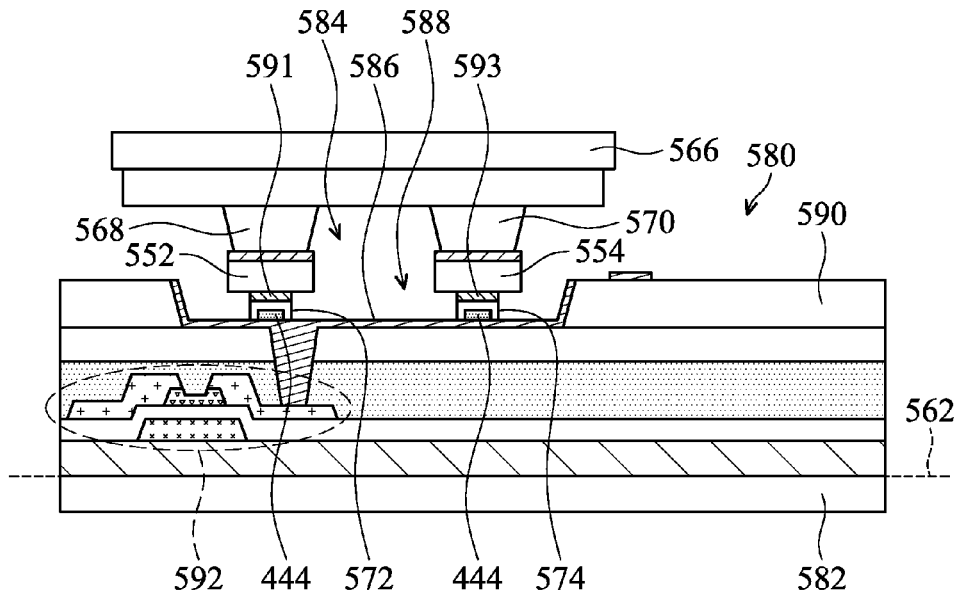
FIGS. 12A and 12B are schematic, cross-sectional views of example embodiments of TFT substrates showing placement of LEDs.
Figure 12:
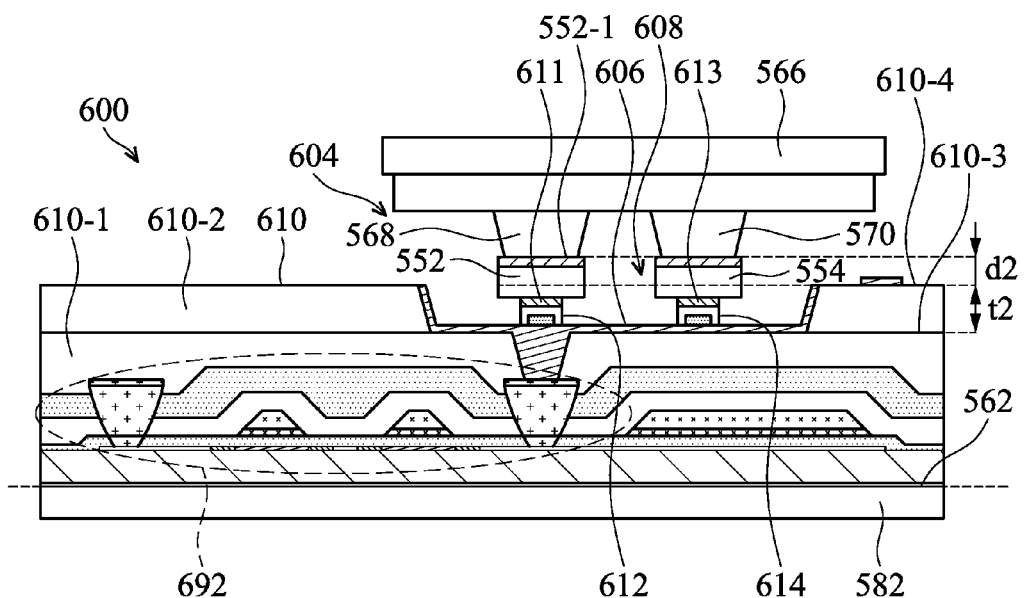

In FIGS. 12A and 12B, placement of the picked LEDs 552, 554 is shown with respect to two example embodiments of a TFT substrate. Specifically, FIG. 12A depicts a TFT substrate 580 with a bottom gate TFT 592 configuration and FIG. 12B depicts a TFT substrate 600 with a top gate TFT 692 configuration, although various other configurations may be used.

As shown in FIG. 12A, TFT substrate 580 is disposed on platform 562 over a heater 582. In this embodiment, a material of the active layer of the bottom gate TFT configuration may comprise amorphous silicon (a-Si), metal oxide (ex. IGZO), or other suitable material. TFT substrate 580 includes a plurality of sub-pixel locations of which one (i.e., sub-pixel location 584) is shown. Sub-pixel location 584 is defined by reflective structure 586, which is formed in an opening 588 of insulating layer 590.

In transferring the LEDs (552, 554) to TFT substrate 580, the transfer heads (568, 570) position the LEDs so that a corresponding one of the plurality of LEDs is disposed at each of the plurality of sub-pixel locations of the TFT substrate. In some embodiments, such as in the embodiment of FIG. 12A, this involves ensuring that at least two LEDs are disposed over the corresponding reflective structure at each of the sub-pixel locations. Thus, in this example, LEDs 552 and 554 are disposed over reflective structure 586 at sub-pixel location 584. Note also that a second electrical contact 591 of LED 552 is placed to electrically contact reflective structure 430 and/or the optional bonding layer 444, and a second electrical contact 593 of LED 554 is placed to electrically contact reflective structure 430 and/or the optional bonding layer 444. Heaters 582 and/or 566 may be used to heat bonding material 572, 574 for fixing the positions of the LEDs with respect to TFT substrate 580. Note that the reflective structure or the optional bonding layer is electrically connected to the source/drain electrodes of the corresponding TFT.

As shown in FIG. 12B, TFT substrate 600 is disposed on platform 562 over heater 582. In this embodiment, a material of the active layer of the top gate TFT configuration may comprise low temperature polysilicon (LTPS), or other suitable material. After top gate TFT 692 formed on the substrate, a first insulating layer 610-1 deposited. The first insulating layer 610-1 could be a planarization layer. Then a second insulating layer is disposed on the first insulating layer 610-1 and forming an opening 608 in the second insulating layer 610-2. TFT substrate 600 includes a plurality of sub-pixel locations, with only sub-pixel location 604 being shown. Sub-pixel location 604 is defined by reflective structure 606, which is formed in the opening 608 of second insulating layer 610-2.

For transferring the LEDs (552, 554) to TFT substrate 600, the transfer heads (568, 570) position over the LEDs so that a corresponding one of the plurality of LEDs is disposed at each of the plurality of sub-pixel locations of the TFT substrate. In this embodiment, LEDs 552 and 554 are disposed over reflective structure 606 at sub-pixel location 604. Specifically, a second electrical contact 611 of LED 552 is placed to electrically contact reflective structure 606 and/or bonding material 612, and a second electrical contact 613 of LED 554 is placed to electrically contact reflective structure 606 and/or bonding material 614. Heaters 582 and/or 562 are used to heat bonding material 612, 614 to fix the positions of the LEDs with respect to TFT substrate 600. In this example, as shown in FIG. 12B, the maximum elevation of LEDs 552, 554 is set at the height of the top surface of a representative one of the LEDs. A ratio of the thickness (t2) measured between a bottom surface 610-3 of second insulating layer and a top surface 610-4 of second insulating layer and a distance (d2) measured between top surface 610-4 and the top surface 552-1 of the LED 552 would be within a range (R). In an embodiment, the range (R) is between approximately 3% of the thickness (t2) and approximately 70% of the thickness (t2) of the second insulating layer 610-2, thus ensuring that the top surfaces 552-1 of the LEDs protrude upwardly beyond the top surface 610-4 of the second insulating layer 610-2 to provide adequate mechanical clearance for the transfer head to prevent transfer head damaging the second insulating layer or the TFT substrate. In an embodiment, the range (R) is between approximately 3% of the thickness (t) and approximately 25% of the thickness (t) of the insulating layer 502. In an embodiment, the range (R) is between approximately 3% of the thickness (t) and approximately 15% of the thickness (t) of the insulating layer 502. In an embodiment, the range (R) is between approximately 40% of the thickness (t) and approximately 70% of the thickness (t) of the insulating layer 502. Further, in another embodiment, the thickness (t) can be measured a portion of the insulating layer above the gate electrode or gate/scan line.

Figure 13:
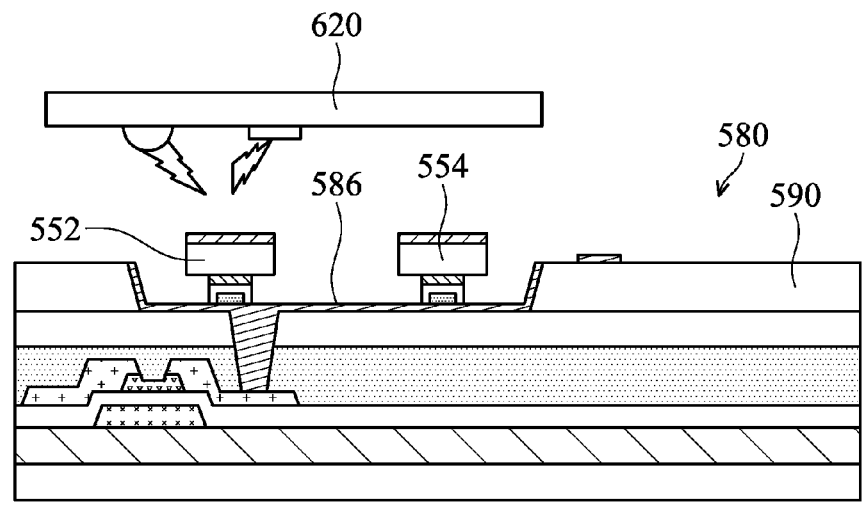
FIGS. 13A and 13B are schematic diagrams depicting example embodiments of testing of LEDs disposed on TFT substrates.
Figure 13:
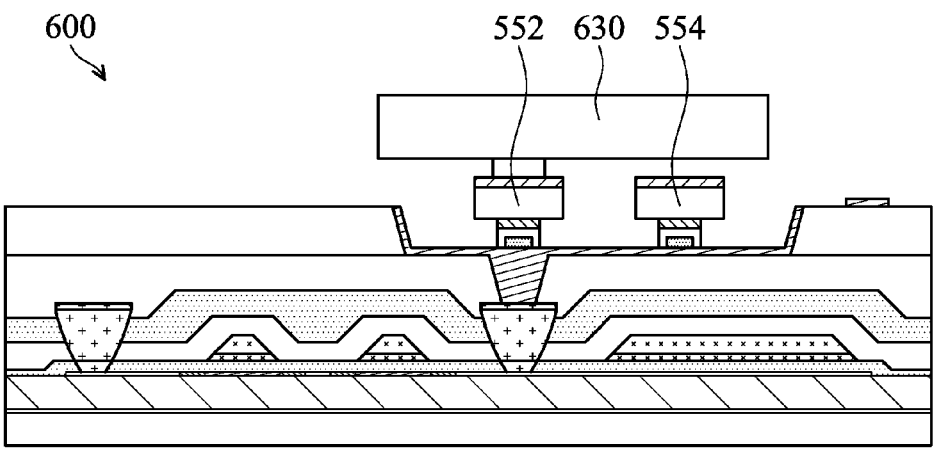

FIGS. 13A and 13B are schematic diagrams depicting example embodiments of testing of LEDs disposed on TFT substrates such as may be performed after the LEDs are transferred from a carrier substrate and fixed in position. Continuing with the example shown and described with respect to FIG. 12A, test equipment 620 is positioned adjacent to LEDs 552 and 554 to conduct photoluminescence testing of one or more of the LEDs of TFT substrate 580. Additionally, or alternatively, electroluminescence testing of one or more of the LEDs may be conducted. An example of electroluminescence testing is depicted in FIG. 13B, in which test equipment 630 is positioned adjacent to LEDs 552 and 554 of TFT substrate 600. By using one or more testing procedures such as photoluminescence and electroluminescence testing, the LEDs may be confirmed as either "good" or "defective".

After performing testing, the TFT substrate may be transferred to a deposition chamber (not shown) for further fabrication. In this regard, multiple processes will now be described using the embodiment of FIG. 13A (i.e., TFT substrate 580) for reference. It should be noted that these processes may be suited for use with other configurations of TFT substrates.

Figure 14:
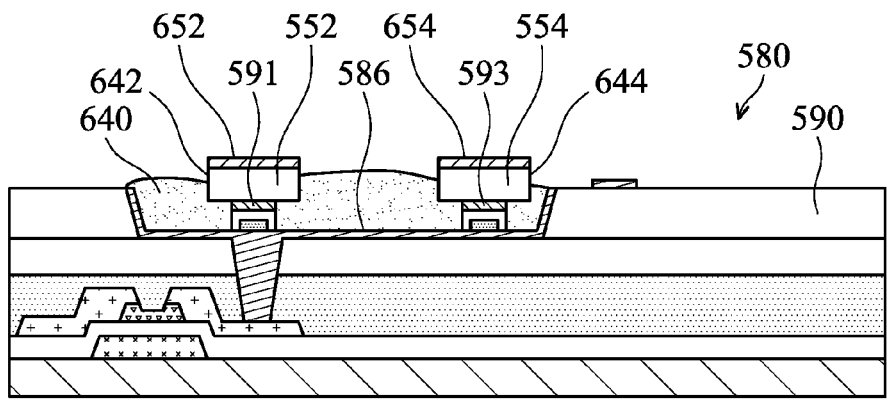
FIG. 14 is a schematic, cross-sectional view of an example embodiment of a TFT substrate with a deposited filling insulator.

As shown in FIG. 14, a filling insulator 640 is deposited at the sub-pixel locations. Filling insulator 640 may be formed of transparent material, such as epoxy, PMMA, benzocyclobutene (BCB), polyimide or combination thereof, for example. In FIG. 14, filling insulator 640 at least partially fills the opening 588 lined by reflective structure 586. As such, filling insulator 640 fills between LEDs 552 and 554, and between the LEDs and reflective structure 586. In this embodiment, filling insulator 640 extends over the second electrical contacts (591, 593) of the LEDs and up the side walls (e.g., side walls 642 and 644) of the LEDs. In other embodiments, filling insulator 640 may only extend over the second electrical contacts (591, 593) of the LEDs for isolating the second electrical contact from other conducting material.

Figure 15:
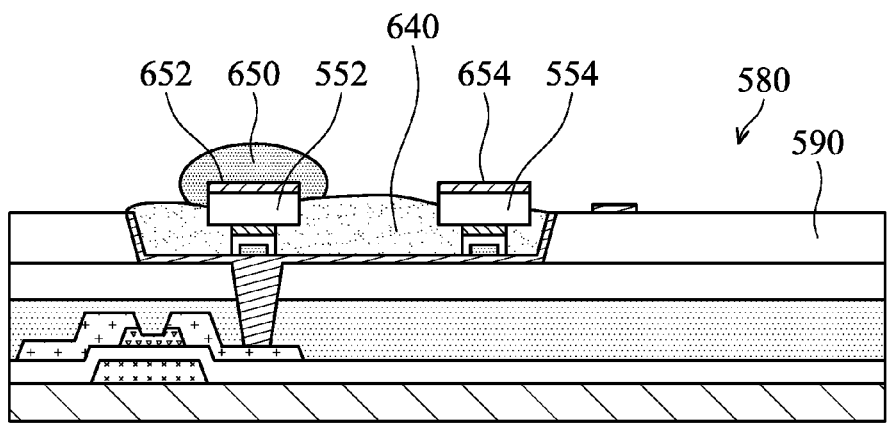
FIG. 15 is a schematic diagram showing an example embodiment of a repair.

As mentioned above, if it is determined that an LED is defective, a repair may be performed. As shown in FIG. 15, an example of a repair is depicted in which a passivation layer 650 is deposited over a defective LED (in this case, LED 552). In particular, LED 552 includes a first electrical contact 652, and LED 554 includes a first electrical contact 654. A passivation layer 650 is provided over first electrical contact 652 of LED 552 to electrically isolate the first electrical contact from a first electrode (shown later) of the display device in which TFT substrate 580 is to be incorporated. In another embodiment, the defective LED could be replaced by a "good" LED, such as when only one LED is provided for a sub-pixel, for example.

Figure 16:
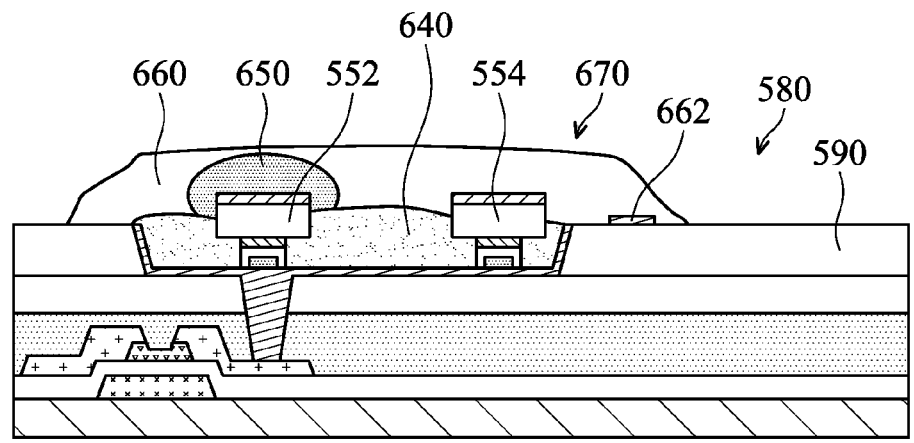
FIG. 16 is a schematic, cross-sectional view of an example embodiment of a TFT substrate with a deposited first electrode.

As shown in FIG. 16, after any defects are repaired as desired, a first electrode 660 may be deposited. The first electrode provides electrically connects the LEDs and associated common lines (e.g., common line 662).

Figure 17A:
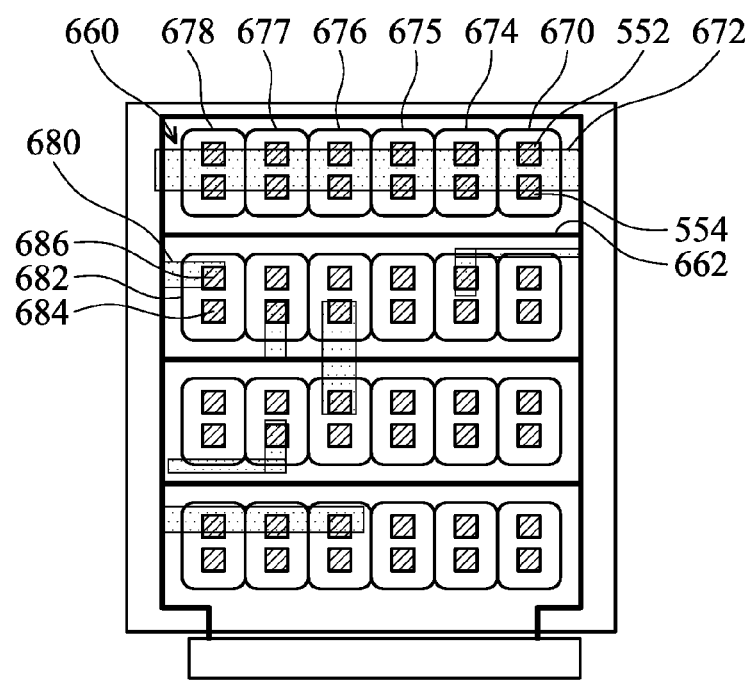
FIG. 17A is a schematic, plan view of an example embodiment showing a first electrode.
Figure 17:
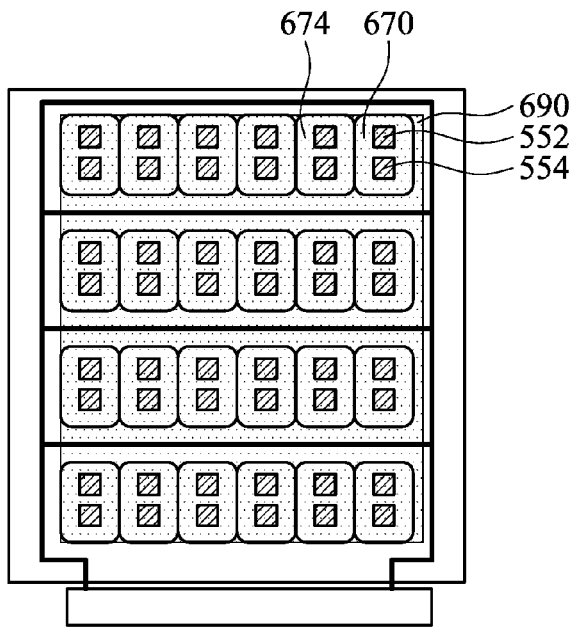
FIG. 17B is a schematic, plan view of another example embodiment showing a first electrode.

With reference to the embodiment of FIG. 17A, it is shown that the first electrode 660 may be patterned to provide discontinuous portions for interconnecting separate groups of the sub-pixels and the common line 662. For instance, sub-pixel 670, which includes LEDs 552 and 554, is associated with first electrode portion 672, which also provides electrical continuity for sub-pixels 674, 675, 676, 677 and 678. First electrode portion 680, however, is patterned so that electrical connection with at least one LED of a sub-pixel is avoided and the passivation layer 650 could be omitted in this embodiment. For example, sub-pixel 682 includes LEDs 684 and 686, with first electrode portion 680 only electrically connecting LED 686. In some embodiments, an LED avoided by a first electrode portion may be a defective LED.

FIG. 17B depicts another example embodiment in which a first electrode has been deposited. In contrast to the patterned variant of FIG. 17A, this embodiment incorporates a contiguous first electrode 690 after the passivation layer 650 is deposited.

Figure 18:
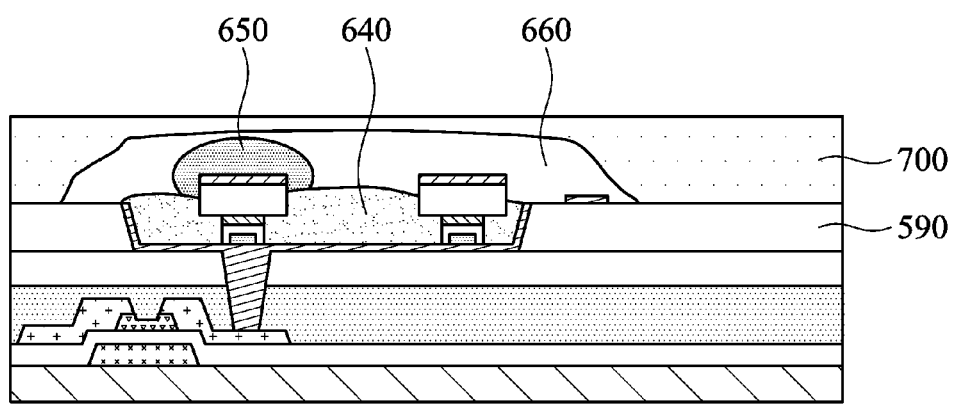
FIG. 18 is a schematic, cross-sectional view of an example embodiment of a TFT substrate with a light guide layer.

Continuing for ease of description (in a non-limiting manner) with the embodiment of FIG. 16, FIG. 18 shows TFT substrate 580 after incorporating a light guide layer 700. In particular, a light guide layer 700 is deposited over first electrode 660. The light guide layer 700 allows the light emitted from an LED to spread out. By using the light guide layer may increase total light emission toward a determined direction (e.g., a viewing direction), increase emission uniformity, and/or increase sharpness of the color spectrum for the display.

Figure 19:
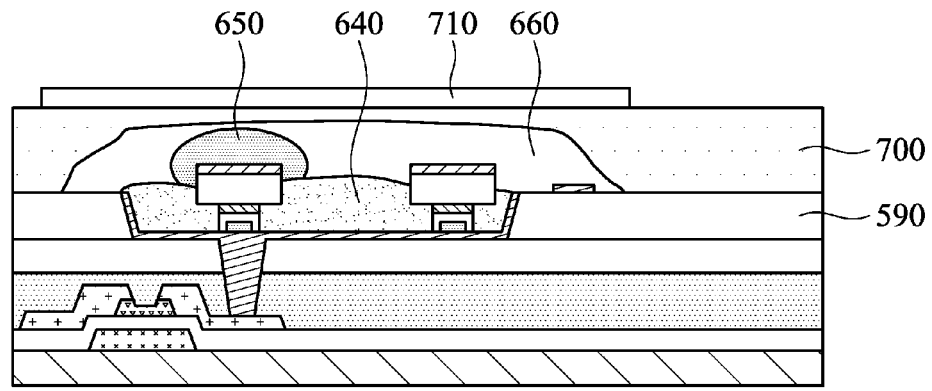
FIG. 19 is a schematic, cross-sectional view of an example embodiment of a TFT substrate with a wavelength conversion layer.

In FIG. 19, a wavelength conversion layer 710 is provided over first electrode 660. In particular, wavelength conversion layer 710 (which may be of various configurations, such as quantum dot, phosphor or combination thereof, for example), is formed over light guide layer 700 in this embodiment. The wavelength conversion layer can convert the wavelength of light emitted from the LED to a target wavelength. For instance, if each LED is to emit only one color spectrum (e.g., all LEDs emit blue light), different wavelength conversion layers can convert the single color spectrum to red, green, blue or other color spectrum.

Figure 20:
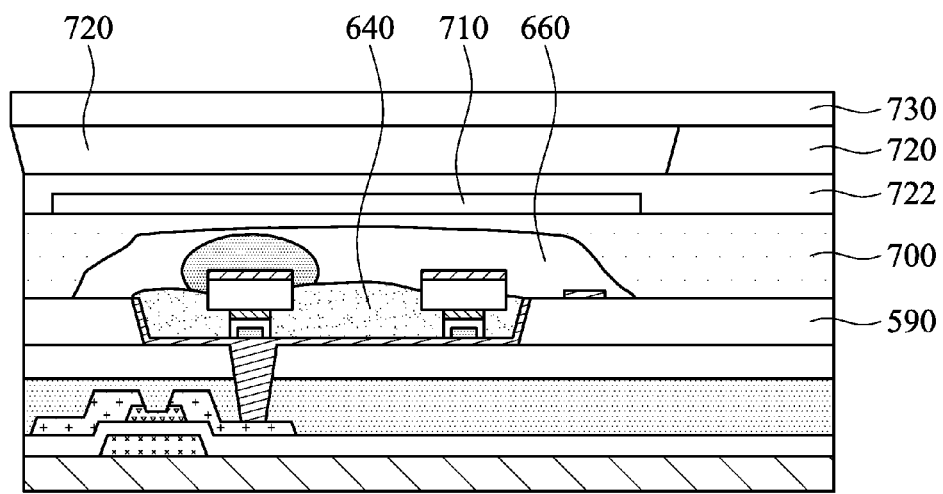
FIG. 20 is a schematic, cross-sectional view of an example embodiment of a TFT substrate with a color filter.

As shown in FIG. 20, a color filter 720 is provided over first electrode 660. Specifically, in this embodiment, color filter 720 is positioned over an optical adhesion layer 722 that is used to adhere color filter 720 to TFT substrate with LEDs. A cover 730 (e.g., a rigid or flexible cover substrate; a glass cover, polarizer, barrier film or capping layer) is provided as a top layer of the structure. The color filter layer can filter out undesired colors emitting from the wavelength conversion layer and sharpen the emission spectrum of light. By way of example, a red color filter layer may be formed over a red wavelength conversion layer in order to filter out colors other than red; a green color filter layer may be formed over a green wavelength conversion layer in order to filter out colors other than green; and, a blue color filter layer may be formed over a blue wavelength conversion layer in order to filter out colors other than blue. It should be noted that the light guide layer, the wavelength conversion layer and the color filter layer are optional and could be selected as desired.

Figure 21:
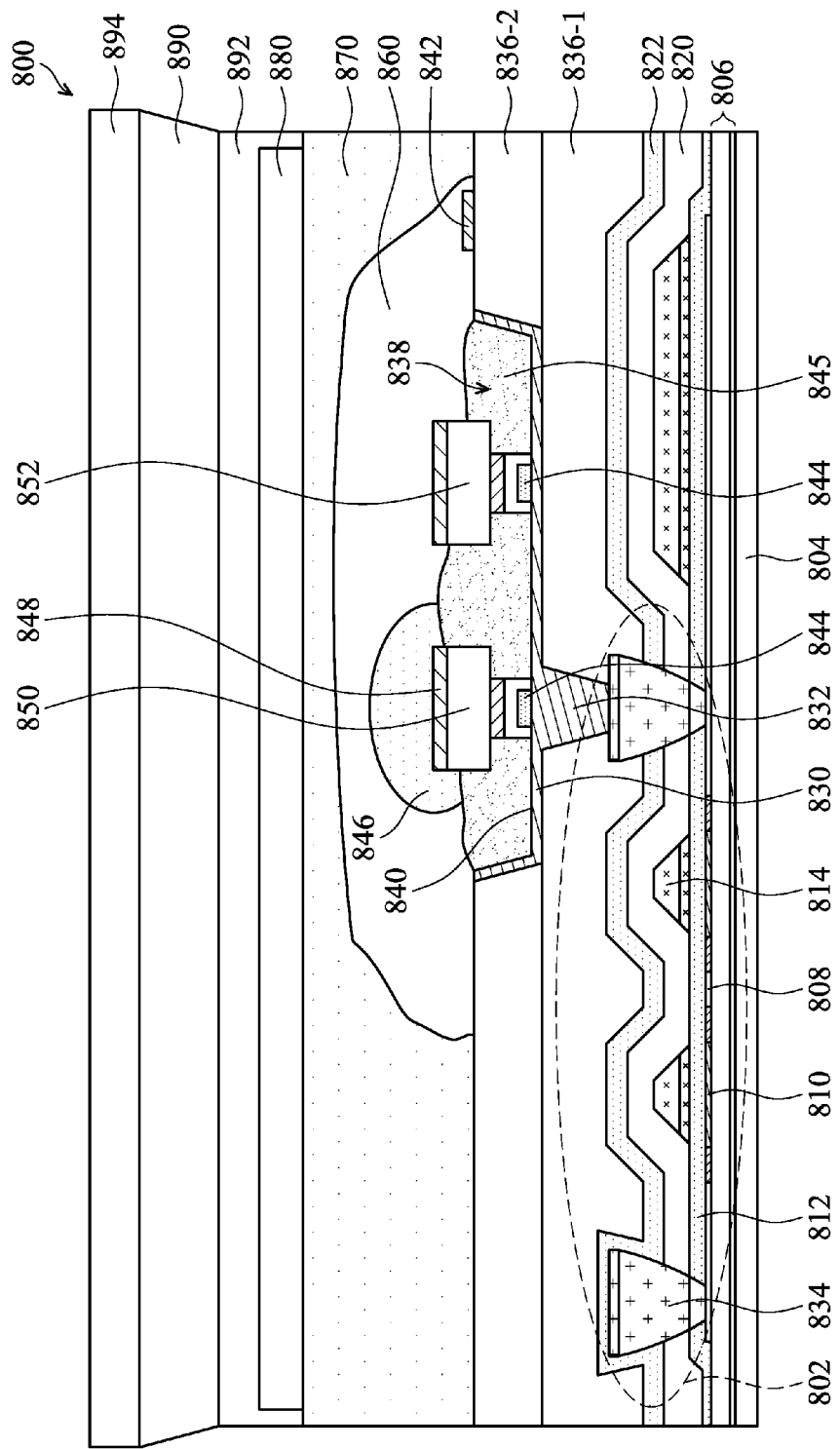
FIG. 21 is a schematic, cross-sectional view of another example embodiment.

Another example embodiment is depicted in FIG. 21, in which a TFT substrate 800 configured with an top gate TFT 802 is provided. As shown in FIG. 21, TFT substrate 800 includes a substrate 804 upon which a buffer layer 806 and an active layer 808 are formed. In this embodiment, the buffer layer 806 is multi-layers. The buffer layer could be a single layer in other embodiments. Re-crystallization (e.g., by excimer laser annealing), patterning to form the channel 810, and channel/N+ doping are performed. Gate insulation layer 812 and metal (M1) layer 814 are subsequently deposited and patterned to form gate electrode and gate lines. Thereafter, first and second passivation layers (820, 822) are deposited. The gate insulation layer 812, the first passivation layer, or the second passivation layer could be a single layer or multi-layers.

Depositing and patterning metal (M2) layer 834 is performed to form source electrode, drain electrode and data lines. First insulating layer 836-1 is deposited and contact via 832 is formed and pass through the first insulating layer 836-1. Then second insulating layer 836-2 is deposited and subsequently etched to form opening 838 in the second insulating layer 836-2. A metal (M3) layer 840 is then deposited within opening 838 to form the reflective structure 830, as well as common lines (e.g., common line 842). The metal (M3) layer 840 is also disposed into the contact via 832. Reflective structure 830 may be used for electrically connecting to a second electrical contact of the associated display device and a corresponding TFT through the contact via 832. An optional bonding (M4) layer 844 may be over reflective structure 830 to facilitate bonding of the LEDs.

FIG. 21 also depicts a filling insulator 845 that fills between LEDs 850 and 852, and between the LEDs and reflective structure 830. A defect repair also is shown that is facilitated by deposition of a passivation layer 846 to electrically isolate a first electrical contact 848 of "defective" LED 850 from first electrode 860. Additionally, a light guide layer 870, a wavelength conversion layer 880, and a color filter 890 are provided over first electrode 860. In this embodiment, color filter 890 is positioned over an optical adhesion layer 892. A cover 894 also is provided as a top layer of the structure. The cover 894 could be a rigid or flexible substrate, e.g., a glass cover, a polarizer, a barrier film or capping layer (inorganic-organic-inorganic layers). It should be noted that the light guide layer, the wavelength conversion layer and the color filter layer are optional and could be selected as desired.

A material of passivation layers mentioned above may comprise inorganic material, organic material. A material of insulating layers mentioned above may comprise inorganic material, organic material, a light shield material or combination thereof. And a material of filling insulator mentioned above may comprise inorganic material, organic material, a light shield material or combination thereof. For example, the organic material can comprise a polymer, such as polyethylene terephthalate (PET), polyimide, polycarbonate, epoxy, polyethylene, and/or a polyacrylate, and the inorganic layer can comprise $SiO_x$, $SiN_x$, $SiO_xN_y$, $TiO_2$, $AlO_x$, $Al_2O_3$, $SrO_x$ or combination thereof.

Figure 22:
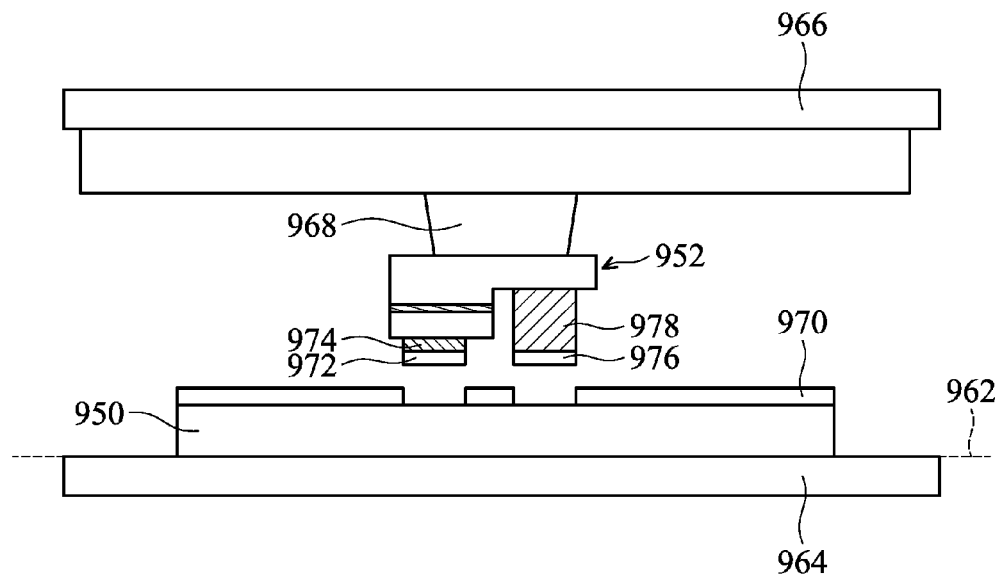
FIG. 22 is a schematic view of another example embodiment showing removal of a flip-chip type LED.

FIG. 22 is a schematic view of another example embodiment of a carrier substrate showing removal of an LED; in this case, a flip-chip type LED. In FIG. 22, carrier substrate 950 has been loaded onto a platform 962 to facilitate LED transfer and placement. Platform 962 incorporates a heater 964 for heating the carrier substrate 950 and the associated bonding layer 970 to a temperature that facilitates release of LED 952 from the carrier substrate.

An array of transfer heads is positioned over the carrier substrate. In this embodiment, a heater 966 also is incorporated with the transfer heads (one of which is shown). In particular, transfer head 968 is positioned over LED 952 and the transfer head is placed in contact with the LED for transferring the LED to a TFT substrate. It should be noted that, the heater is optional.

Transfer of the LEDs (e.g., LED 952) may be performed as described before resulting in bonding material from a bonding layer 970 adhering to electrical contacts of the LED after the LED is removed from the carrier substrate. Specifically, bonding material 972 adheres to second electrical contact 974 and bonding material 976 adheres to first electrical contact 978. The first electrical contact 978 could be electrically connected to the common line, and the second electrical contact 974 could be electrically connected to the drain electrode of the corresponding TFT of the sub-pixel.

Figure 23:
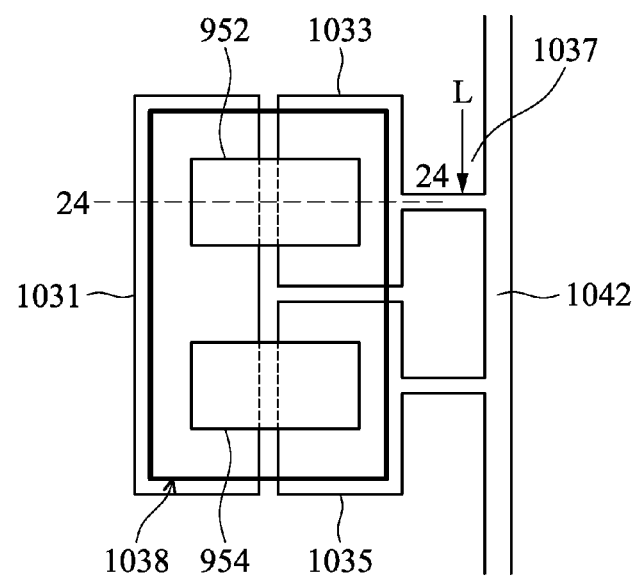
FIG. 23 is a schematic, plan view of another example embodiment.
Figure 24:
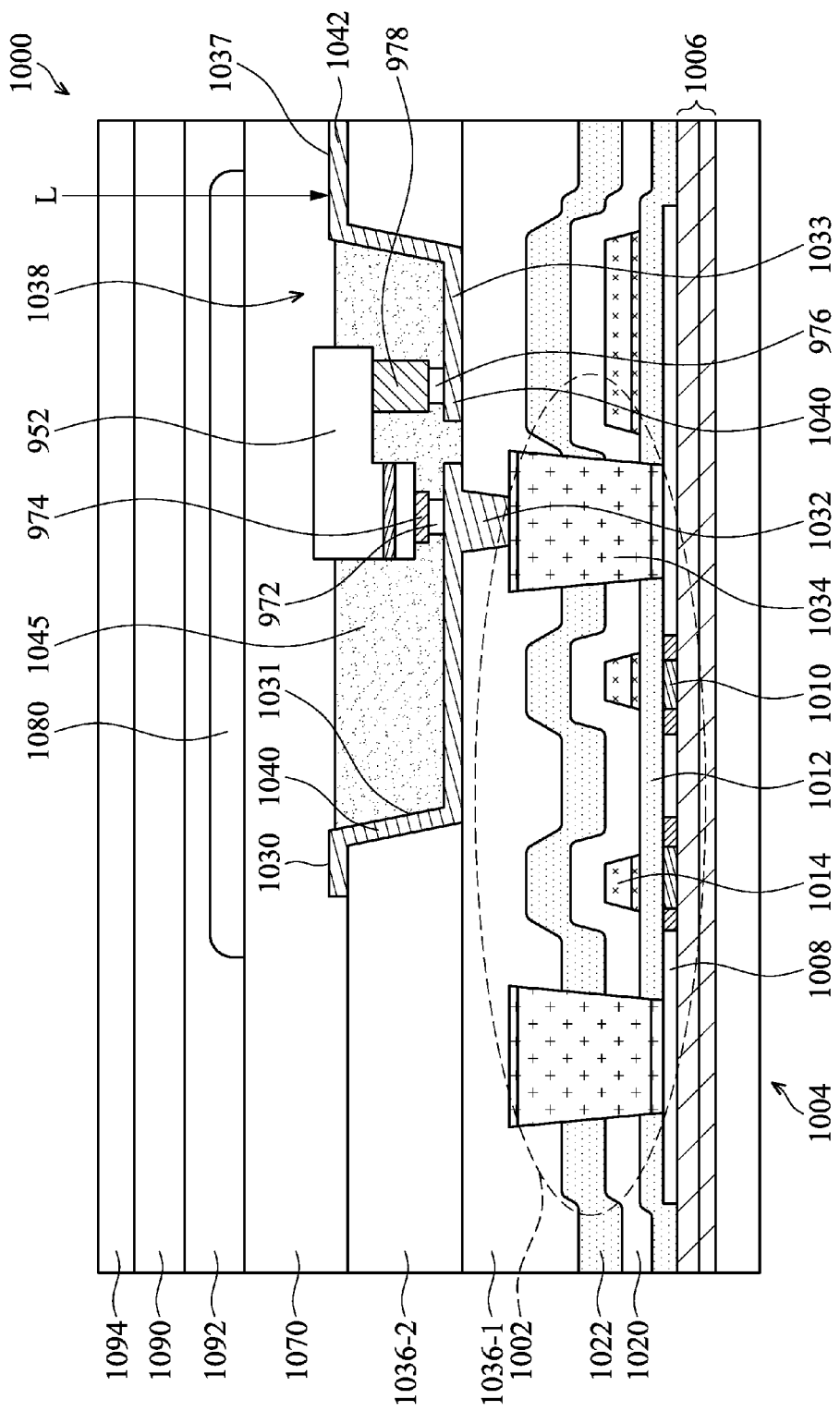
FIG. 24 is a schematic, cross-sectional view of another example embodiment of a portion of a display device.

Continuing with the embodiment of FIG. 22, placement of the LEDs from carrier substrate 950 is shown in FIG. 23 (which depicts a plan or layout view) and FIG. 24 (which depicts a cross-sectional view). As shown in FIGS. 23 and 24, LEDs 952, 954 are incorporated into a display device 1000 that is configured with a top gate TFT 1002 (e.g., LTPS TFT). Display device 1000 includes a TFT substrate 1004 upon which a buffer layer 1006 and an active layer 1008 are formed. In this embodiment, the buffer layer 1006 is multi-layers. The buffer layer could be a single layer in other embodiments. Re-crystallization, patterning to form the channel 1010, and channel/N+ doping are performed. Gate insulation layer 1012 and metal (M1) layer 1014 are deposited and patterned to form gate electrode and gate lines. Thereafter, first and second passivation layers (1020, 1022) are deposited. The gate insulation layer, the first passivation layer, or the second passivation layer could be a single layer or multi-layers.

Depositing and patterning metal (M2) layer 1034 is performed to form source electrode, drain electrode and data lines. First insulating layer 1036-1 is deposited and then contact via 1032 is formed. Then second insulating layer 1036-2 is deposited and subsequently etched to form opening 1038 in the second insulating layer 1036-2. A metal (M3) layer 1040 is then deposited within opening 1038 to form reflective structure, as well as common lines (e.g., common line 1042). And the metal (M3) layer 1040 is also disposed into the contact via 1032. In this embodiment, the reflective structure 1030 is formed by separate portions (shown more clearly in FIG. 23), with reflective portion 1031 functioning as an anode and electrically connecting to second electrical contact 974 of LED 952, reflective portion 1033 serving as a connection from first electrical contact 978 of LED 952 to common line 1042, and reflective portion 1035 serving as a connection from first electrical contact of LED 954 to common line 1042. A filling insulator 1045 at least partially fills between LEDs 952 and 954, and between the LEDs and reflective structure 1030 to stabilize the positions of LEDs 952 and 954.

In FIG. 24, a defect repair also is shown that is facilitated by laser cutting the M3 layer to electrically isolate first electrical contact 978 of "defective" LED 952 from a common line 1042 of the display device. In this embodiment, laser cutting is performed at an interconnect portion 1037 of the M3 layer that extends between the reflective portion 1033 and common line 1042 (note that the laser cutting is depicted by arrow L)

Additionally, a light guide layer 1070, a wavelength conversion layer 1080, and a color filter 1090 are provided. In this embodiment, color filter 1090 is positioned over an optical adhesion layer 1092. A cover 1094 also is provided as a top layer of the structure. The cover 1094 could be a rigid or flexible substrate, e.g., a glass cover, a polarizer, a barrier film or capping layer (inorganic-organic-inorganic layers). It should be noted that the light guide layer, the wavelength conversion layer and the color filter layer are optional and could be selected as desired.

Figure 25:
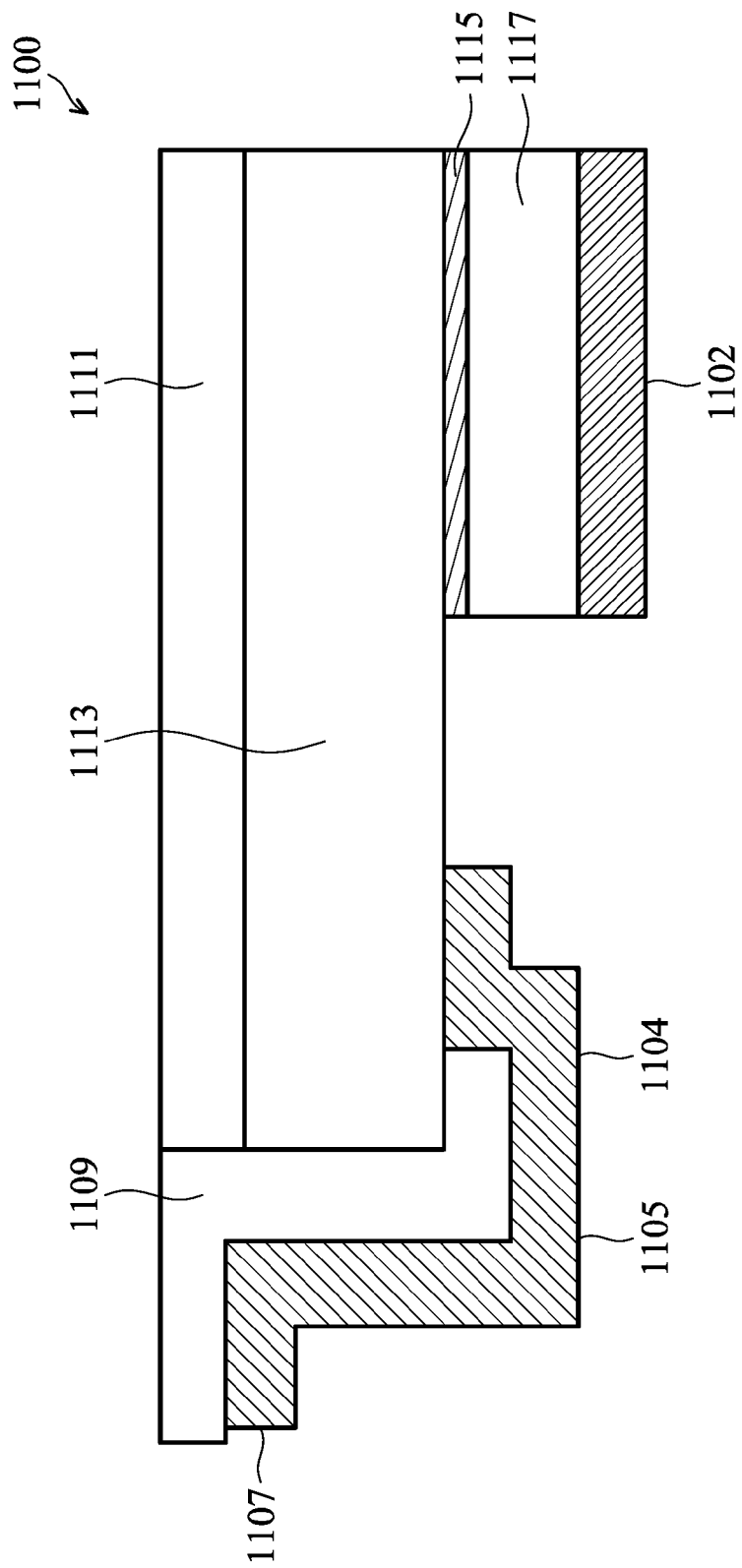
FIG. 25 is a schematic view of another example embodiment of an LED.

Another embodiment of an LED that may be used in cooperation with above embodiments is depicted in FIG. 25. As shown in FIG. 25, LED 1100 is a hybrid device that incorporates a second electrical contact 1102 and a first electrical contact 1104. LED 1100 may include a first conductive semiconductor layer 1117, a multi quantum well layer 1115 formed on the first conductive semiconductor layer 1117, and a second conductive semiconductor layer 1113 formed on the multi quantum well layer 1115. Note that the second electrical contact 1102 is positioned at the bottom of the device, whereas the first electrical contact 1104 includes a portion 1105 positioned at the bottom as well as a portion 1107 positioned adjacent to the top of the device. The first conductive semiconductor layer 1117 and the second conductive semiconductor layer 1113 may be a p-type semiconductor layer and n-type semiconductor layer, respectively. An undoped semiconductor layer 1111 may be formed on the second conductive semiconductor layer 1113.

The conductive protection layer 1109 may protect the first electrical contact 1104 from laser beams used to separate an LED growth substrate (e.g., sapphire substrate) and an LED 1100 during a laser lift off process. The conductive protection layer 1109 is formed of a material for absorbing laser beams (band gap of conductive protection layer is smaller than that of laser beams during laser lift off process). For instance, the conductive protection layer may be formed of Indium Tin Oxide (ITO), ZnO, $SnO_2$, or $TiO_2$. It should be emphasized that the above-described embodiments are merely examples of possible implementations. Many variations and modifications may be made to the above-described embodiments without departing from the principles of the present disclosure. All such modifications and variations are intended to be included herein within the scope of this disclosure.

What is claimed is:

1. A method for manufacturing a display device comprising:
providing a thin film transistor (TFT) substrate having a plurality of sub-pixel locations and a plurality of TFTs corresponding to the plurality of sub-pixel locations, wherein a first electrode is disposed at one of the plurality of sub-pixel locations;
providing a carrier substrate supporting a plurality of light emitting diodes (LEDs), wherein each of the plurality of LEDs has a first electrical contact and a second electrical contact;
transferring the plurality of LEDs from the carrier substrate to the TFT substrate, with at least two of the plurality of LEDs being disposed at the one of the plurality of sub-pixel locations;
fixing positions of the plurality of LEDs with respect to the TFT substrate;
determining that one of the at least two of the plurality of LEDs at the one of the plurality of sub-pixel locations is defective; and
laser cutting the first electrode disposed at the one of the plurality of sub-pixel locations.

2. The method of claim 1, further comprising:
providing a filling insulator at the one of the plurality of sub-pixel locations, wherein the filling insulator fills between the at least two of the plurality of LEDs disposed at the one of the plurality of sub-pixel locations.

3. The method of claim 2, further comprising:
electrically isolating the one of the at least two of the plurality of LEDs determined to be defective.

4. The method of claim 3, wherein the electrically isolating comprises providing a passivation layer over the first electrical contact of the one of the at least two of the plurality of LEDs determined to be defective.

5. The method of claim 3, further comprising forming a first electrode over the plurality of LEDs.

6. The method of claim 5, wherein the one of the plurality of LEDs determined to be defective is not covered by the first electrode.

7. The method of claim 6, further comprising providing at least one of a color filter and a wavelength conversion layer over the first electrode layer.

8. The method of claim 1, wherein:
in providing the TFT substrate, the one of sub-pixel locations has a corresponding reflective structure; and
in transferring the plurality of LEDs from the carrier substrate to the TFT substrate, the at least two of the plurality of LEDs are disposed over the corresponding reflective structure at the one of the plurality of sub-pixel locations.

9. The method of claim 8, wherein:
in providing the TFT substrate, an insulating layer is provided;
after the fixing positions of the plurality of LEDs, the plurality of LEDs exhibit a maximum elevation with respect to the TFT substrate; and
a top surface of the insulating layer is positioned to be lower than the maximum elevation.

10. The method of claim 9, wherein:
the insulating layer is provided at a thickness (t) extending between a bottom surface of the insulating layer and a top surface of the insulating layer; and
a distance (d) between the top surface of the insulating layer and the maximum elevation is between approximately 3% of the thickness and approximately 70% of the thickness.

11. A method for manufacturing a display device comprising:
providing a thin film transistor (TFT) substrate having a plurality of sub-pixel locations and a plurality of TFTs;
providing a carrier substrate supporting a plurality of light emitting diodes (LEDs), wherein each of the plurality of LEDs has a first electrical contact and a second electrical contact;
transferring the plurality of LEDs from the carrier substrate to the TFT substrate, with a corresponding one of the plurality of LEDs being disposed at each of the plurality of sub-pixel locations;
fixing positions of the plurality of LEDs with respect to the TFT substrate;
providing a filling insulator contacting sidewalls of the plurality of LEDs;
determining that a first LED of the plurality of LEDs is defective; and
electrically isolating the first electrical contact of the first LED determined to be defective, wherein electrically isolating the first electrical contact comprises laser cutting a first electrode of the display device.

12. The method of claim 11, wherein the first electrode of the display device is not disposed over the first LED determined to be defective.

13. The method of claim 11, wherein, in transferring the plurality of LEDs, at least two of the plurality of LEDs are disposed at each of the plurality of sub-pixel locations.

14. The method of claim 11, wherein:
in providing the TFT substrate, an insulating layer is provided;
after the fixing positions of the plurality of LEDs, the plurality of LEDs exhibit a maximum elevation with respect to the TFT substrate; and
a top surface of the insulating layer is positioned to be lower than the maximum elevation.

15. The method of claim 14, wherein:
the insulating layer is provided at a thickness (t) extending between a bottom surface of the insulating layer and a top surface of the insulating layer; and a distance (d) between the top surface of the insulating layer and the maximum elevation is between approximately 3% of the thickness and approximately 70% of the thickness.

* * * * *